United States Patent [19]

Cline et al.

[11] Patent Number: 5,841,707
[45] Date of Patent: Nov. 24, 1998

[54] APPARATUS AND METHOD FOR A PROGRAMMABLE INTERVAL TIMING GENERATOR IN A SEMICONDUCTOR MEMORY

[75] Inventors: Danny R. Cline, Plano, Tex.; Francis Hii, Singapore, Singapore

[73] Assignee: Texas Instruments Incorporated, Dallas, Tex.

[21] Appl. No.: 758,138

[22] Filed: Nov. 25, 1996

[51] Int. Cl.$^6$ .................................................. G11C 7/00
[52] U.S. Cl. ..................... 365/194; 365/193; 327/276; 327/278
[58] Field of Search .................... 365/193, 194; 327/261, 270, 276, 278, 279, 281

[56] References Cited

U.S. PATENT DOCUMENTS

| | | | |
|---|---|---|---|
| 5,459,422 | 10/1995 | Behrin | 327/276 |
| 5,596,538 | 1/1997 | Joo | 365/194 |
| 5,642,319 | 6/1997 | Nagashima | 365/194 |

*Primary Examiner*—Son Mai
*Attorney, Agent, or Firm*—Robby T. Holland; Richard L. Donaldson

[57] ABSTRACT

Programmable time delay apparatus includes a plurality of similar components (10) which determine the total time delay of the apparatus. These components have gate units ($31_0$–$31_n$, $32_0$–$=_n$, $33_0$–$33_n$, $34_0$–$34_n$) coupled thereto which, in response to a control signal ($b_0$–$b_n$) applied to each component, either electrically couples the component to the apparatus or electrically removes of the component from the apparatus. In a fist embodiment, the control signals ($b_0$–$b_n$) place time delay components (10) in a series configuration, the total time delay being the sum of the time delays of each series-coupled component (10). In the second and third embodiment, the resistors ($47_0$–$47_n$) and the capacitors ($53_0$–$53_n$), respectively, are coupled in a capacitance charging circuit ($47_0$–$47_n$, 43; 52, $53_0$–$53_n$), the coupled elements controlling the charging rate and, consequently, the time delay of the apparatus. By coupling the apparatus in a ring configuration (FIG. 6), a counter unit (63), counting the number of signal delays through the delay apparatus (61) can lengthen the programmed time delay.

1 Claim, 2 Drawing Sheets

5,841,707

APPARATUS AND METHOD FOR A PROGRAMMABLE INTERVAL TIMING GENERATOR IN A SEMICONDUCTOR MEMORY

This application claims priority under 35 USC §119(e)(1) of provisional application number 60/007,676, filed Nov. 29, 1996.

BACKGROUND OF THE INVENTION

1. Field of the Invention

This invention relates generally to semiconductor memory units implemented in integrated circuit technology and, more particularly, to the generation of delayed clock pulses in each memory unit which synchronize the operation of the stages of the memory unit.

2. Description of the Related Art

In semiconductor memory units implemented in integrated circuit technology, the operation of the memory unit stages is typically initiated with a signal, such as a RAS (row address signal) signal or a clock signal, generated by the associated central processing unit. In order to synchronize the operation of the memory stages, the initiating signal is used to generate delayed activation signals which control the operation of the individual stages of the memory unit.

Referring to FIG. 1a, the signal delay circuit 10 which, in the prior art, is used to generate a delay signal having a predetermined delay time, is shown. An input signal, SIGNAL IN, is applied to a gate terminal of n-channel field-effect transistor 11 and to a gate terminal of p-channel field-effect transistor 12. The source terminal of transistor 12 is coupled to the $V_{DD}$ voltage supply terminal, while the source terminal of transistor 11 is coupled to the ground potential. The drain terminal of transistor 12 is coupled to the drain terminal of transistor 11, to a first terminal of capacitor 13, and to an input terminal of inverting amplifier 14. The second terminal of capacitor 13 is coupled to the ground potential, while the output terminal of inverting amplifier 14 is the output signal, SIGNAL OUT, of the delay circuit.

Referring to FIG. 1b, a comparison of an idealized input signal, SIGNAL IN, and an idealized output signal, SIGNAL OUT, of the delay circuit 10 is shown. The input signal has a negative-going step at a given time $t_o$. The output signal provides a negative-going step delayed by a time, D, with respect to the negative-going step of the input signal. The time delay, D, is a function of the size of capacitor C and the parameters of the semiconductor components. To provide an activation signal with a given time delay, the processing steps in fabricating the delay circuit have, in the past, been adjusted to provide the proper parameters which result in the desired time delay. The adjustments have included alteration of the masks used in fabricating the component. The changing of processing steps is time consuming and expensive.

To eliminate the need to adjust the fabrication of the components of the semiconductor chip to provide a delay circuit with the correct parameters, FIG. 2 shows a configuration wherein a plurality of delay circuits 10' through 10''' are coupled in series. Each delay circuit is provided with switches, 21' through 21''' and 22' through 22'''. The switches 21' through 21''' and 22' through 22''' can be placed in an open or closed position. The state of the switches 21' through 21''' and 22' through 22''' determine which of the delay circuits 10' through 10''' are electrically coupled in a series connection. By appropriate selection of the parameters of the individual delay circuits 10' through 10''' and the selection of the particular delay circuits 10' through 10''' coupled in series between the SIGNAL IN terminal and the SIGNAL OUT terminal, the delay of SIGNAL OUT signal can be controlled during the fabrication by the removal of conducting paths. When the delay time D is not satisfactory, a relatively simple change in the fabrication process, i.e. setting the state of the switches 21' through 21''' and 22' through 22''', can provide a controlled change in the delay time D. Although the setting of the switches in the fabrication process, or in the case of setting of the switches through post fabrication processes such as with laser techniques, provides an improvement over the adjustment of parameters of an individual delay circuit, further improvement in the ability to control the delay time D is desirable.

A need has therefore been felt for an apparatus and an associated method to provide a time delay apparatus which can be controlled without changing of the process steps. It would be further desirable to provide a time delay D of an output signal with respect to an input signal which can be controllably adjusted after fabrication by internally generated signals. It would be also desirable to control the delay time D of the delay circuit output signal by externally applied signals.

SUMMARY OF THE INVENTION

The aforementioned and other features are accomplished, according to the present invention, by apparatus implemented in semiconductor memory technology which provides a programmable time delay, the time delay being determined by control signals. According to one embodiment, a plurality of time delay components, each having a predetermined time delay, have gate units coupled thereto. The gate units, in response to the state of an applied control signal, either electrically couple the component in a series configuration or remove the time delay component from the series configuration of the delay components. The resulting total time delay is the sum of the time delays of the time delay components coupled in the series configuration as a result of the control signals. In a second embodiment, control signals are applied to gate units coupled to a plurality of parallelly-coupled resistors in a time delay component. The control signals determine which of the resistors is coupled to a capacitor. The delay time of the component between the input signal and the output signal is determined by the rate of charging of the capacitor through the electrically coupled resistors. In a third embodiment, a time delay component has a plurality of parallelly-coupled capacitors, each capacitor having a gate element coupled thereto. The response to the an associated control signal, each capacitor is either electrically coupled in series with the other capacitors or electrically removed from the circuit. The time delay of the component is determined by the size of the capacitance, i.e., by the number of coupled capacitors being charged through capacitor-charging elements and by the parameters of the capacitor-charging elements. A longer time delay can be provided by including any of the embodiments in a ring configuration and using a counter unit to generate a delayed signal after a selected number of time delays by the time delay unit.

These and other features of the present invention will be understood upon the reading of the Specification in conjunction with the Figures.

BRIEF DESCRIPTION OF THE DRAWINGS

FIG 1a illustrates a schematic diagram of the signal delay circuit according to the prior art, while FIG. 1b is a comparison, of the output signal relative to the input signal for the circuit shown in FIG. 1a.

DESCRIPTION OF THE PREFERRED EMBODIMENT(S)

1. Detailed Description of the Drawings

Figure 1A:
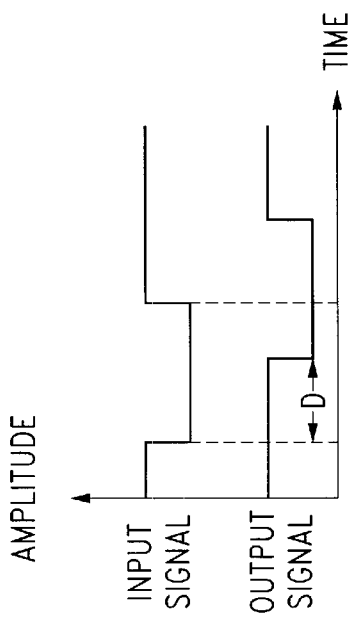
Figure 1B:
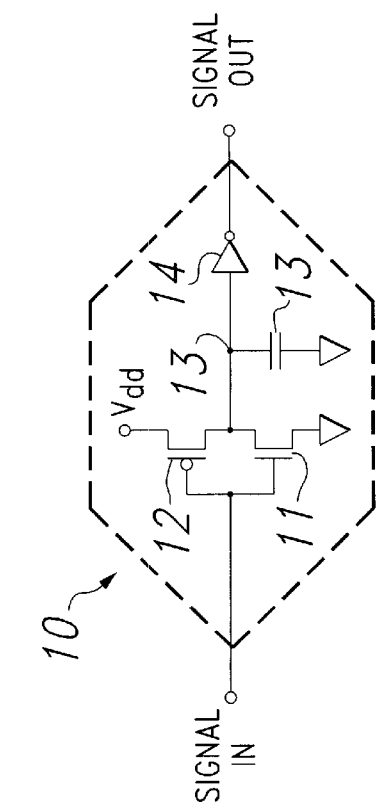
Figure 2:
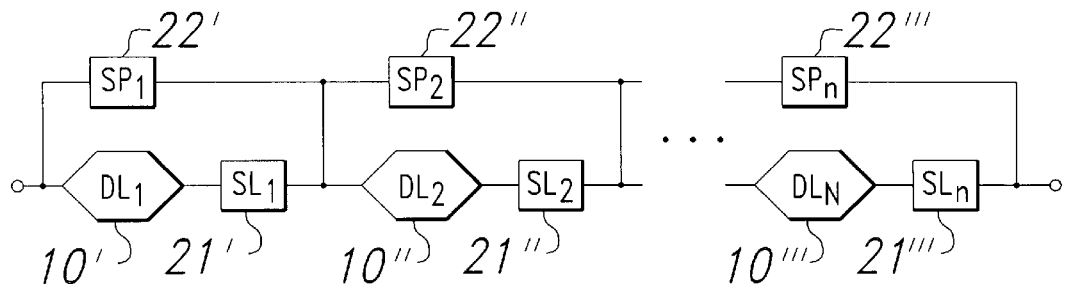
FIG. 2 illustrates a technique for controlling the delay time D of an output signal relative to an input signal according to the prior art.

FIGS. 1a, 1b and 2 have been discussed with respect to the prior art.

Figure 3:
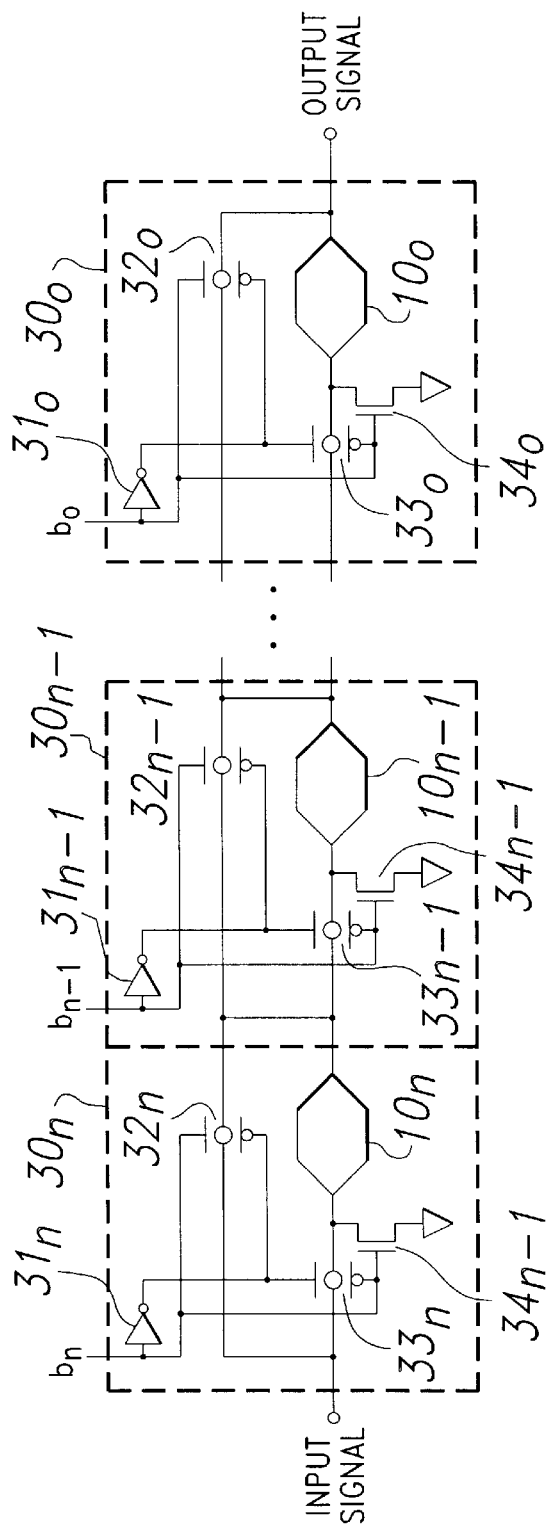
FIG. 3 illustrates a first embodiment of a programmable time delay suitable for use with a semiconductor memory according to the present invention.

Referring to FIG. 3, the programmable delay apparatus of the present invention is shown. The delay apparatus comprises a plurality of delay components $30_n$ through $30_o$, coupled in series. Each delay component $30_x$ includes a delay circuit $10_x$. The signal terminals of a gate element $32_x$ is coupled between an input terminal of delay component $30_x$ and an output terminal of delay component $30_x$. The output terminal of delay circuit $10_x$ is coupled to the output terminal of the delay component $30_x$, while the input terminal of delay component $30_x$ is coupled through the signal terminal of gate element $33_x$ to an input terminal of delay circuit $10_x$. The input terminal of gate $10_x$ is coupled through n-channel field effect transistor $34_x$ to the ground potential. A control signal $b_x$ is coupled to an input terminal of inverting amplifier $31_x$, to the n-channel control terminal of gate element $32_x$, to the p-channel control terminal of gate element $33_x$, and to the gate terminal of transistor $34_x$. The output terminal of inverting amplifier $31_x$ is coupled to the p-channel control terminal of gate element $32_x$ and to the n-channel control terminal of gate element $33_x$.

Figure 4:
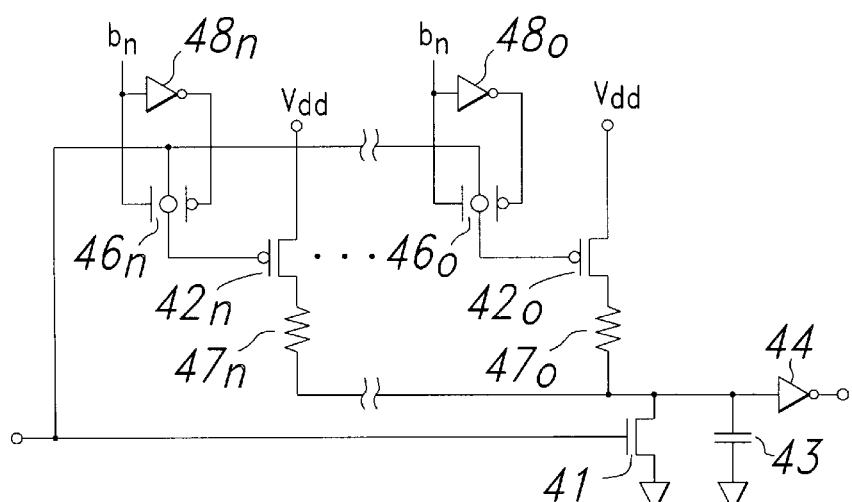
FIG. 4 illustrates a second embodiment of a programmable time delay suitable for use with a semiconductor memory according to the present invention.

Referring to FIG. 4, a second implementation of the programmable delay apparatus, according to the present invention, is shown. The INPUT SIGNAL is applied to a gate terminal of n-channel transistor 41. The drain terminal of transistor 41 is coupled to the input terminal of inverting amplifier 44, while the source terminal of transistor 41 is coupled to ground potential. The input terminal of inverting amplifier 44 is also coupled through capacitor 43 to the ground potential. In addition, the input terminal of inverting amplifier 44 is coupled to a series of resistors $47_n$ through $47_o$. Each of the resistors $47_n$ through $47_o$ is coupled to the drain terminals of p-channel field effect transistors $42_n$ through $42_o$, respectively. The source terminals of transistors $42_n$ through $42_o$ are coupled to the supply voltage $V_{DD}$, while the gate terminals of each of transistors $42_n$ through $42_o$ is coupled to a first signal terminal of gate elements $42_n$ through $42_o$, respectively. A second signal terminal of gate elements $46_n$ through $46_o$ receives the input signal. The control terminals of gate elements $46_n$ through $46_o$ are coupled to the input and the output terminals of inverting amplifiers $48_n$ through $48_o$ respectively. The input terminals of inverting amplifiers $48_n$ through $48_o$ have control signals $b_n$ through $b_o$, respectively, applied thereto. The output terminal of inverting amplifier 44 supplies the OUTPUT SIGNAL.

Figure 5:
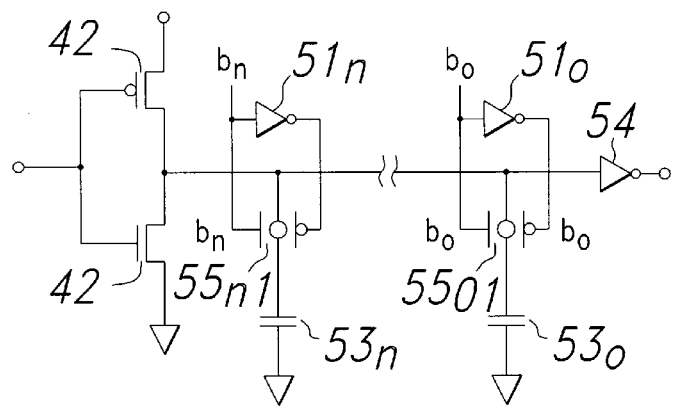
FIG. 5 illustrates a third embodiment of a programmable time delay suitable for use in a semiconductor memory according to the present invention.

Referring to FIG. 5, another implementation of the programmable delay apparatus is shown. In this implementation, the INPUT SIGNAL is applied to a gate terminal of p-channel field effect transistor 52 and to a gate terminal of n-channel field effect transistor 51. A drain terminal of transistor 52 is coupled to an input terminal of inverting amplifier 54 and to a drain of transistor 51. The source terminal of transistor 51 is coupled to the ground potential. Also coupled to the input terminal of inverting amplifier 54 is a first signal terminal of a plurality of gate elements $55_n$ through $55_o$. A second signal terminal of each of gate elements $55_n$ through $55_o$ is coupled through capacitors $53_n$ through $53_o$, respectively, to the ground potential. The control terminals of gate elements $55_n$ through $55_o$ are coupled to input and output terminals of investing amplifiers $59_n$ through $59_o$, respectively. The input terminals of each of inverting amplifiers $59_n$ through $59_o$ is coupled to control signals $b_n$ through $b_o$, respectively.

Figure 6:
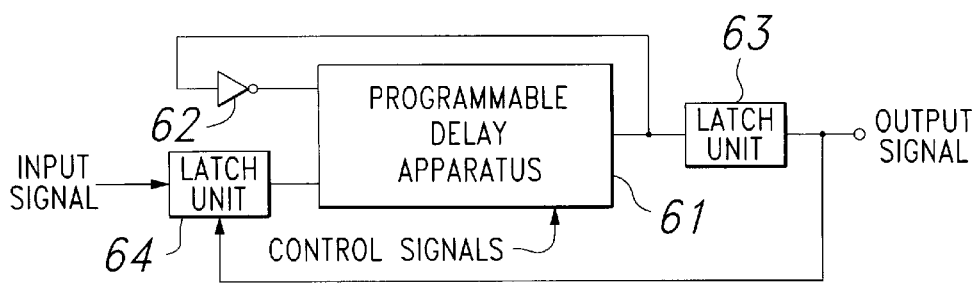
FIG. 6 illustrates a circuit for increasing the range of a time delay suitable for use with the programmable time delay apparatus of the present invention.

Referring to FIG. 6, a programmable delay apparatus 61 has an input terminal coupled to an output terminal of inverting amplifier 62. An output terminal of programmable delay apparatus 61 is coupled to an input terminal of inverting amplifier 62, to an input terminal of counter unit 63, and to a reset terminal of latch unit 64. The output terminal of the counter unit 63 supplies the OUTPUT SIGNAL. The INPUT SIGNAL is applied to the latch unit 64 which initiates the operation, but prevents additional INPUT SIGNALS from affecting the operation until the output signal has reset the latch unit 64.

2. Operation of the Preferred Embodiment(s) Referring once again to FIG. 3, each stage of the delay apparatus includes a delay circuit $10_n$ through $10_o$. The sets of gate elements, $32_n$ through $32_o$ and $33_n$ through $33_o$, can either insert the delay circuits $10_n$ through $10_o$ in a series configuration or can electrically remove the delay circuits $10_n$ through $10_o$ from the series configuration depending on the state of the associated input signals $b_n$ through $b_o$ associated with each delay circuit. The delay time D of the delay apparatus is thus the sum of the delays times $D_n$ through $D_o$ for each of the delay circuits which are coupled in the series configuration.

In the implementation of the programmable delay apparatus of FIG. 4, the delay time D of the apparatus is controlled by the resistors $47_n$ through $47_o$ through which the capacitor 43 is charged. The control signals determine which gate elements are activated. The activated gate elements, in turn, establish which transistors are activated. The activated transistors place the resistors in the charging circuit of the capacitor 43. The resistors in the charging circuit determine the time constant of the charging operation and, consequently, determine the delay time D of the OUTPUT SIGNAL.

Referring to the programmable delay apparatus of FIG. 5, the control signals $b_n$ through $b_o$ activate selected ones of the gate elements $55_n$ through $55_o$. The activated gate elements couple selected capacitors $53_n$ through $53_o$, each associated with the activated gate elements, to the input terminal of inverting amplifier 54. The coupled capacitors determine the charging time and therefore the delay time of the OUTPUT SIGNAL relative to the INPUT SIGNAL.

Referring to FIG. 6, a technique for providing longer delay times than can be reasonably provided in the available semiconductor chip processing technology is shown. In essence, the INPUT SIGNAL initiates the operation of the programmable delay apparatus. However, the output signal of the programmable delay apparatus, after being counted by the counter unit, is applied to the input of the programmable delay apparatus. After passage through the programmable delay apparatus, another count is entered in the counter unit. After a selected number of counts has been detected by the counter unit, the OUTPUT SIGNAL is generated by the counter unit and the apparatus initialized in preparation for the next INPUT SIGNAL. In this manner, the delay time D can be expanded, reducing the number of elements required to provide desired range of delay times.

The programmable delay apparatus of the present invention is provided by selectively coupling a plurality of elements, each providing a preestablished delay time, in response to control signals. The control signals can be generated internally or externally and can be stored in a latch circuit or in a register. The programmable delay apparatus can therefore be incorporated on every semiconductor chip and the exact value of the delay time selected after the fabrication. This programmable delay time can be used to compensate for variations in circuits resulting from the fabrication process. Further flexibility can be obtained by applying control signals to counter unit in the circuit described in relation to FIG. 6.

It will be clear that each of the components which can be coupled into the programmable delay circuit need not provide the same delay. Rather the delay times of the individual components can be chosen to provide a requisite delay time accuracy over a predetermined range of delay times. It will also be clear that the delay for a positive signal edge can be provided with appropriate changes in the individual components.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A programmable time delay apparatus capable of being implemented in semiconductor memory technology, a time delay of said time delay apparatus determined in response to a plurality of control signals, comprising:

a plurality of time delay components coupled in a series configuration, each component including:
a time delay circuit;
a gate means responsive to a first state of a control signal for coupling an input terminal of said time delay circuit to an input signal, a second state of said control signal causing said input signal to by-pass said time delay circuit;
a counter unit coupled to an output terminal of said programmable time delay apparatus; and
an inverting amplifier coupled to said output terminal of said programmable time delay apparatus and to an input terminal of said programmable time delay apparatus.

\* \* \* \* \*